United States Patent [19]
Cosgrove et al.

[11] Patent Number: 5,920,187
[45] Date of Patent: Jul. 6, 1999

[54] DUAL PATH ATTENUATOR FOR A HIGH FREQUENCY CALIBRATION CIRCUIT

[75] Inventors: Kevin E. Cosgrove; Richard J. Huard, both of Beaverton, Oreg.

[73] Assignee: Tektronix, Inc., Wilsonville, Oreg.

[21] Appl. No.: 08/759,989

[22] Filed: Dec. 3, 1996

Related U.S. Application Data

[62] Division of application No. 08/488,395, Jun. 7, 1995, Pat. No. 5,621,310, which is a division of application No. 08/275,577, Jul. 15, 1994, abandoned.

[51] Int. Cl.$^6$ .................................................. G01R 11/32
[52] U.S. Cl. .......................................... 324/74; 324/601
[58] Field of Search ................................ 324/130, 601, 324/74; 702/85, 86, 107

[56] References Cited

U.S. PATENT DOCUMENTS

| | | | |
|---|---|---|---|
| 3,480,862 | 11/1969 | Bayer | 324/130 |
| 3,600,675 | 8/1971 | Grenler | 324/600 |
| 3,783,380 | 1/1974 | Bradley | 324/130 |
| 3,906,344 | 9/1975 | Addis et al. | 324/121 R |
| 4,382,227 | 5/1983 | Olivenbaum et al. | 324/115 |
| 4,803,423 | 2/1989 | Boutigny | 324/130 |
| 5,552,714 | 9/1996 | Adamian et al. | 324/601 |
| 5,578,932 | 11/1996 | Adamian | 324/601 |

OTHER PUBLICATIONS

"11A72 Input Attenuators/Relay Drivers <1> Schematic" Unpublished, circa 1990. (Month Unavailable).

*Primary Examiner*—Josie Ballato
*Assistant Examiner*—Russell M. Kobert
*Attorney, Agent, or Firm*—Boulden G. Griffith; Thomas F. Lenihan

[57] ABSTRACT

A high-frequency calibration method and circuit including a dual path step attenuator. A calibration system is provided having a switch between the user signal input and the instrument input and an amplifier between the calibration signal input and the instrument input. The amplifier provides signal conditioning. The output of the amplifier is connected to the instrument input through a switch and a resistor, the resistor isolating the switch from the instrument input so as effectively to prevent degradation of the user input signal. A sense amplifier provides a calibration signal output indicative of the input impedance of the instrument input in response to a known stimulus. The input of the sense amplifier is isolated from the instrument input by a resistor. A current source provides a known stimulus to the instrument input to measure input impedance. A step attenuator is provided having an attenuated path and an unattenuated path. The signal input may be switched from the attenuated path to the unattenuated path. A compensation circuit is provided in the attenuated path to compensate for the impedances of switches used to select the amount of attenuation. The calibration input amplifier and sense amplifier are connected to the instrument input via the unattenuated path of the step attenuator. When the signal input is switched to the unattenuated path, the calibration input is switched to the attenuated path, and when the signal input is switched to the attenuated path, the calibration input is switched to the unattenuated path.

18 Claims, 4 Drawing Sheets

DUAL PATH ATTENUATOR FOR A HIGH FREQUENCY CALIBRATION CIRCUIT

This application is a division application from application Ser. No. 08/488,395, filed Jun. 7, 1995, now U.S. Pat. No. 5,621,310, which was a division application from application Ser. No. 08/275,577, filed Jul. 15, 1994 now abandoned.

BACKGROUND OF THE INVENTION

This invention relates to calibration systems and attenuators, and particularly to circuits and methods for calibrating step attenuator inputs of test and measurement instruments and outputs of signal generators.

In the field of test and measurement it is often desirable to provide an instrument, such as an oscilloscope or spectrum analyzer, with the capability of performing self-calibration. Modern computer processor based instrumentation permits this to be done using computer software embedded in the instrument. In such instruments an analog input signal is converted to digital form so that signal measurement and analysis can be carried out by a computer processor in the instrument. A common method for performing self-calibration is to provide a known stimulus, such as a known voltage, current or frequency, to the instrument and program the instrument to calibrate itself to provide a desired response to that known stimulus.

Ordinarily, when a calibration stimulus signal and a signal to be measured are applied simultaneously to an instrument, the instrument response is misleading. Switching the instrument input between the user input, to which the signal to be measured is applied, and the calibration input, to which the calibration stimulus is applied, is a common solution to the problem. Disadvantages to this solution are that the switch introduces a source of signal degradation at high frequencies, characterized by reduced bandwidth and increased rise time, and added expense.

In addition, it is common to utilize a step attenuator at the signal input of such a test or measurement instrument or at the output of a test signal source such as a signal generator. Prior step attenuators ordinarily comprise a number of attenuator pads in series and corresponding switches for switching the pads into or out of the signal path. Input signals pass through each switch, regardless of whether its corresponding pad is switched in or switched out. A disadvantage of such attenuators is that each switch degrades the input signal. Degradation may be kept to an acceptable level by using high performance switches, but such switches are intolerably large and comparatively expensive.

Moreover, in calibrating an instrument having a step attenuator, the instrument should be calibrated for each of the attenuation steps. Where a step attenuator is used and the attenuator input is switched between the user input and the calibration input, the problem of signal degradation due to the introduction of switches is compounded.

Therefore, it can be seen that there is a need for a calibration system that permits an instrument to respond either to a signal to be measured or to a calibration signal without introducing the degradation ordinarily associated with the use of a switch and without producing an unreliable measurement. There is also a need for a method for employing a step attenuator in an instrument without introducing signal degradation.

SUMMARY OF THE INVENTION

The present invention overcomes the aforementioned disadvantages and meets the aforementioned needs by providing a calibration system having a switch between the user signal input and the instrument input and an amplifier between the reference signal input and the instrument input. The amplifier provides buffering, which permits its output to be connected to the instrument input through a switch and a resistor, the resistor isolating the switch from the instrument input so as effectively to prevent degradation of the input signal.

A sense amplifier is also connected to the instrument input to provide a calibration signal output indicative of the input impedance of the instrument input in response to a known stimulus. The input of the sense amplifier is isolated from the instrument input by a resistor. The calibration input amplifier includes a current source for driving the instrument input to make an input impedance measurement.

A step attenuator is provided having an attenuated path and an unattenuated path. A compensation circuit is provided in the attenuated path to compensate for the impedances of switches used to select the amount of attenuation and thereby effectively eliminate degradation caused by the aforementioned switch impedances.

The calibration input amplifier and sense amplifier are connected to the instrument input via the unattenuated path of the step attenuator. When the user signal input is switched to the unattenuated path, the reference input is switched to the attenuated path, and when the user signal input is switched to the attenuated path, the reference input is switched to the unattenuated path.

Therefore, it is a principal object of the present invention to provide a novel high frequency calibration circuit and method.

It is another principal object of the present invention to provide a novel step attenuator circuit and attenuation method.

It is a further principal object of the present invention to provide a novel high frequency calibration circuit including a step attenuator.

It is yet another object of the present invention to provide a calibration circuit which permits a signal to be measured and a calibration stimulus to be connected simultaneously without producing unreliable results or excessive signal degradation.

It is yet a further object of the present invention to provide a step attenuator which reduces signal degradation due to switch contacts.

The foregoing and other objects, features and advantages of the invention will be more readily understood upon consideration of the following detailed description of the invention, taken in conjunction with the accompanying drawings.

DETAILED DESCRIPTION OF THE INVENTION

Figure 1:
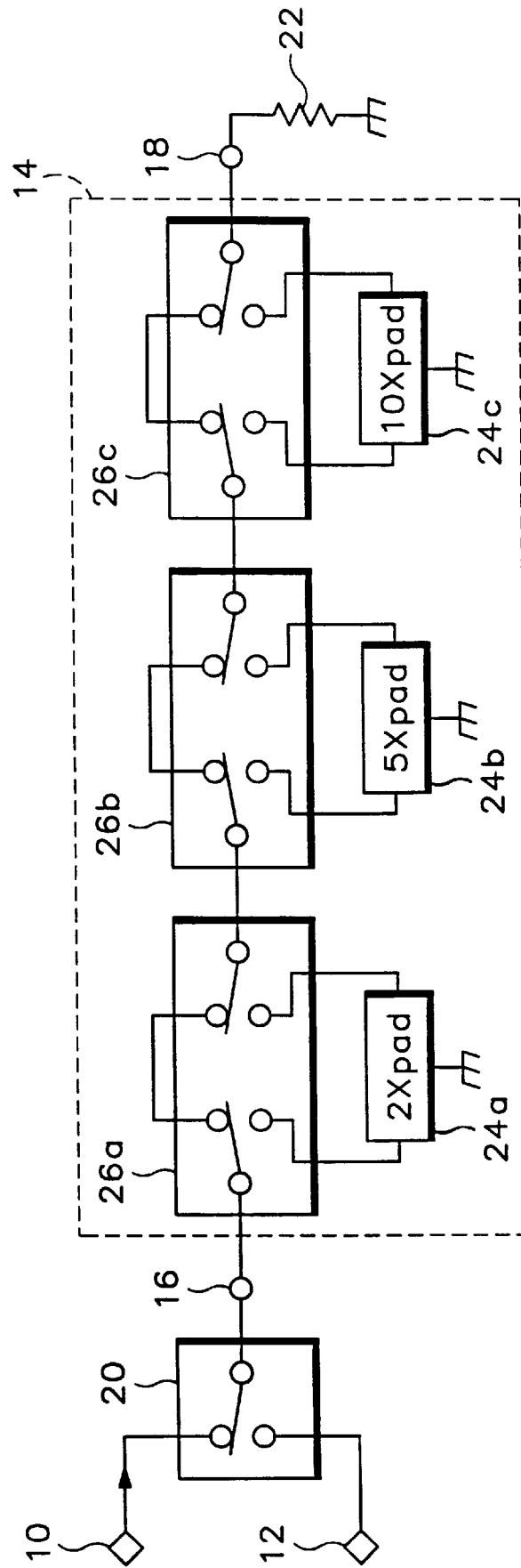
FIG. 1 is a schematic diagram of a prior art calibration circuit including a prior art step attenuator.

Referring to FIG. 1, a prior art calibration circuit including a step attenuator typically comprises a reference input 10, a user input 12, a step attenuator 14, having an attenuator input 16 and an attenuator output 18, and a single-pole-double-throw ("SPDT") input switch 20 which connects the attenuator input 16 either to the reference input 10 or the user input 12, the attenuator output 18 being connected to an input of a measurement instrument represented by input load impedance 22. The step attenuator 14 comprises a series of attenuation elements such as attenuation pads 24a, 24b, and 24c, and respective double-pole-double-throw ("DPDT") switches 26a, 26b, and 26c, connected in parallel with the pads in 24a, 24b, and 24c, so that each of the respective pads may be switched into or out of the signal path from the attenuator input 16 to the attenuator output 18. When the pads are switched out, the signal follows an unattenuated signal path, and when the pads are switched in, the signal follows an attenuated signal path. Pads of the type employed in the step attenuator are commonly understood in the art and are designed so as to attenuate the signal by some predetermined factor, e.g., one-half, one-fifth or one-tenth, when they are switched into the signal path. In such an attenuator, the impedances associated with each of the switches degrades the signal at high frequencies, thereby placing a limit on the usefulness of the instrument with which the circuit is associated.

In the use of such a prior art calibration circuit, three input parameters typically are calibrated. They are input current, input impedance and gain. Input current and input impedance are typically calibrated only without attenuation. Gain is typically calibrated with and without attenuation. Signals suitable for calibrating input current, input resistance and gain are applied to the reference input.

Input current calibration requires the application of a fixed voltage with two selectable source resistances, typically less than one ohm and approximately 450 ohms, respectively. Input resistance calibration requires the application of a known voltage with a known source resistance. Gain calibration requires the application of an adjustable voltage source with a very low source resistance. The gain of each attenuator pad combination may be characterized by setting the associated DPDT switches appropriately.

Figure 2:
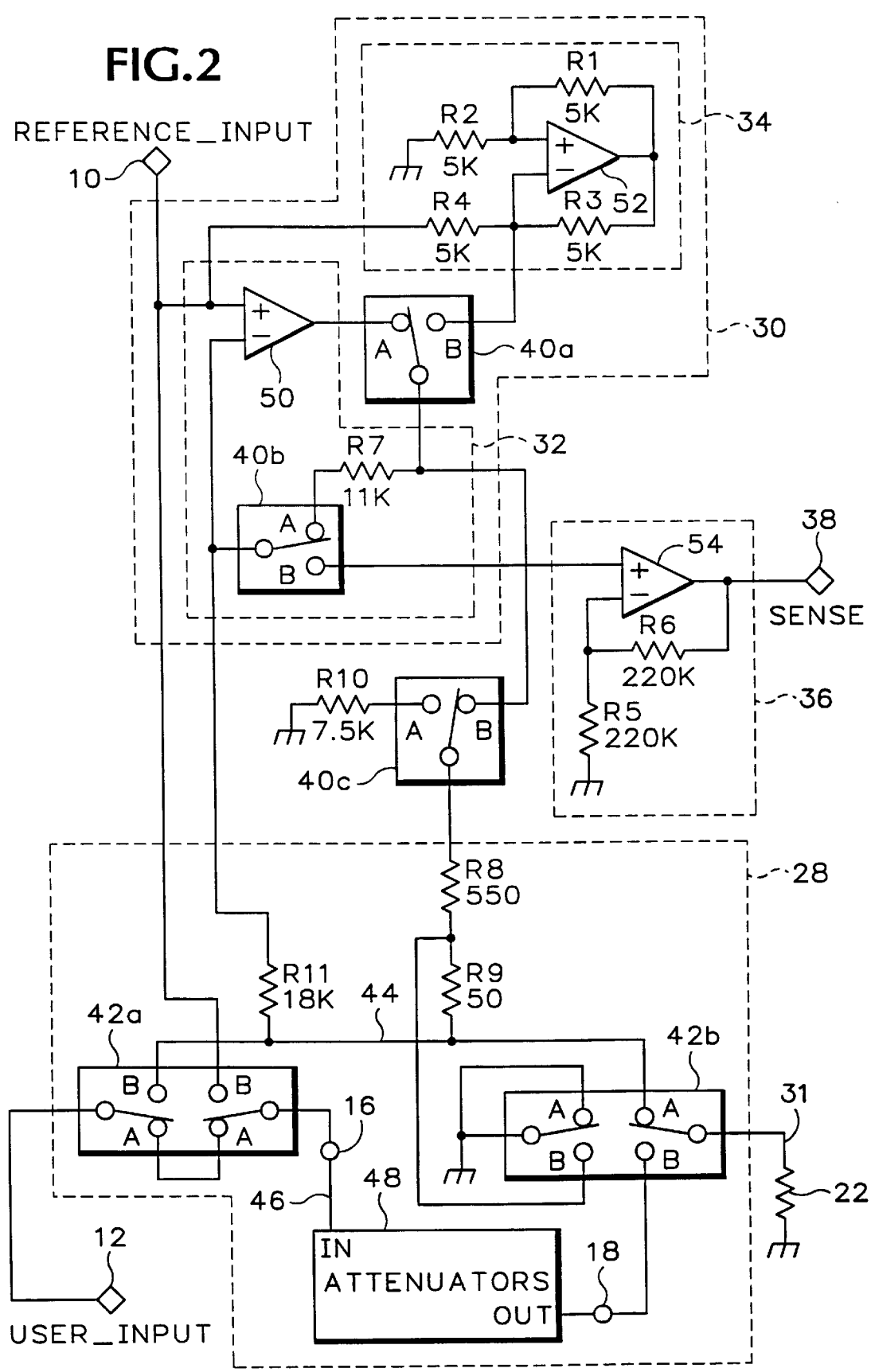
FIG. 2 is a schematic diagram of a preferred embodiment of a calibration circuit according to the principles of the present invention.

Turning now to FIG. 2, the calibration circuit and method of the present invention provides a non-attenuated signal path with a reduced number of switch elements so as to reduce the degradation of user applied signals during normal use, and employs an attenuator which includes a compensation network which compensates for, and thereby reduces the degradation caused by, the impedances associated with switches in the step attenuator.

A preferred embodiment of a calibration circuit according to the present invention comprises an attenuator section 28, having a reference input 10, a user input 12 and a measurement signal output 31, and a reference signal input amplifier 30, having voltage amplifier 32 and a voltage-to-current converter 34. In addition, the calibration circuit preferably includes a sense amplifier 36, having a sense signal output 38, for calibrating the input resistance of the instrument. SPDT switches 40a, 40b, and 40c are included to select the type of calibration to take place. DPDT switches 42a and 42b are included within the attenuator section 28 to switch between calibration mode and measurement mode and, in either case, to select between a non-attenuated path 44 and an attenuated path 46. That is, DPDT switch 42a either connects the user input to the non-attenuated path 44 and the reference input to the attenuated path 46, or connects the user input to the attenuated path 46, the reference signal input being applied through voltage amplifier 32 or voltage-to-current converter 34 to the non-attenuated path 44 during calibration. DPDT switch 42b selects, as the signal to be applied to measurement output 31, either a signal from the non-attenuated path 44 or a signal from the attenuated path 46. The attenuated path 46 includes an attenuator 48, ordinarily a step attenuator of any appropriate design, although the attenuator embodiments described herein are preferred.

In addition to the DPDT switch 42a, the DPDT switch 42b and attenuator 48, the attenuator section 28 includes a sense resistor R11, a first shunt resistor R8 and a second shunt resistor R9, whose functions will be explained below. Attenuator section 28 is preferably fabricated on a substrate suitable for high frequency circuitry, the signal paths on the circuit board having the characteristics of transmission lines at high frequencies. In particular, the non-attenuated signal path preferably comprises a microstrip conductor on a substrate. Resistors R8, R9, and R11, are preferably constructed as thick film devices, R9 and R11 overlaying non-attenuated path 44 for connection thereto.

The reference input 10 is applied simultaneously to switch 42a, voltage amplifier 32 and voltage-to-current amplifier 34.

Voltage amplifier 32 comprises operational amplifier 50 and a feedback network, as is commonly understood in the art. The output impedance is selectable. When voltage amplifier 32 is in its lowest output impedance mode, the sense portion of the feedback network is selected by SPDT switches 40b and 40c to be R11. The output impedance is essentially zero in this mode. When voltage amplifier 32 is in a higher output impedance mode, the feedback network is selected by SPDT switches 40b and 40c to comprise resistors R7, R8, R9 and R11. Preferably the output impedance in this mode should be about 450 ohms, because that impedance forms a ten to one voltage divider with a standard 50 ohm input impedance and thereby makes subsequent calculations easier.

Switch 40a selects, as a calibration source, either the output from voltage amplifier 32 or the output from voltage-to-current converter 34.

The voltage-to-current converter 34 comprises an operational amplifier 52 having input resistor R4, negative feedback resistor R3, ground resistor R2 and positive feedback resistor R1. As is commonly understood in the art, this circuit will convert a given voltage applied to reference input 10 to a corresponding current applied to SPDT switch 40a. Preferably, the output current of voltage-to-current converter 34 is equal to the voltage at the reference input divided by the value of resistor R4.

Sense amplifier 36 is provided as an alternative, and preferred, approach to measurement of instrument input resistance. Sense amplifier 36 comprises operational amplifier 54, ground resistor R5, feedback resistor R6, and resistor R11, which acts as an input resistor to sense amplifier 36. As is commonly understood in the art, this circuit operates as a voltage amplifier. When SPDT switch 40b connects resistor R11 to operational amplifier 54, sense amplifier 36 provides, at its sense output 38, a voltage representative of the voltage applied to input load impedance 22 which, when a known current is applied to input load impedance 22, represents the value of the input load impedance 22, that is, the input impedance of the instrument.

The calibration circuit and method of the present invention would ordinarily be used with a digital measurement instrument such as a digital oscilloscope. In the prior art, the signal at input 18 of FIG. 1 would be applied to an analog-to-digital convertor whose output would be processed digitally. That output would be used for voltage gain, current gain and input impedance calibration. In the present invention the output 38 of the sense amplifier 36 in FIG. 2 is preferably applied to a separate analog-to-digital convertor whose output is selected by the instrument for input impedance calibration.

Resistor R10, connected to SPDT switch 40c, is provided to minimize noise on the non-attenuated path 44 during non-attenuated user input measurements.

Operation of the calibration circuit, and the calibration method inherent therein, is shown by the switch selections and input signals in Table 1 below. An "x" indicates that the switch selection doesn't matter.

TABLE 1

| SWITCH | 40a | 40b | 40c | 42a | 42b | COMMENTS |
|---|---|---|---|---|---|---|
| Parameter | | | | | | |
| Input Current | A | B | B | A | A | Vref = 0V, 0Ω source |
| Input Current | A | A | B | A | A | Vref = 0V, ~450Ω source |
| Input Resistance | B | B | B | A | A | L22 Vref ÷ R4 |
| 1X Gain | A | B | B | A | A | Vref from 0Ω source |
| Attenuated Gain | X | X | X | B | B | Vref from 0Ω source |
| 1X Gain | A | A | A | B | A | User input selected |
| Attenuated Gain | X | X | X | A | B | User input selected |

It should be recognized that, in contrast to the prior art, the calibration circuit and method of this invention only requires a voltage reference having a relatively low source resistance as the calibration signal input.

Figure 3:
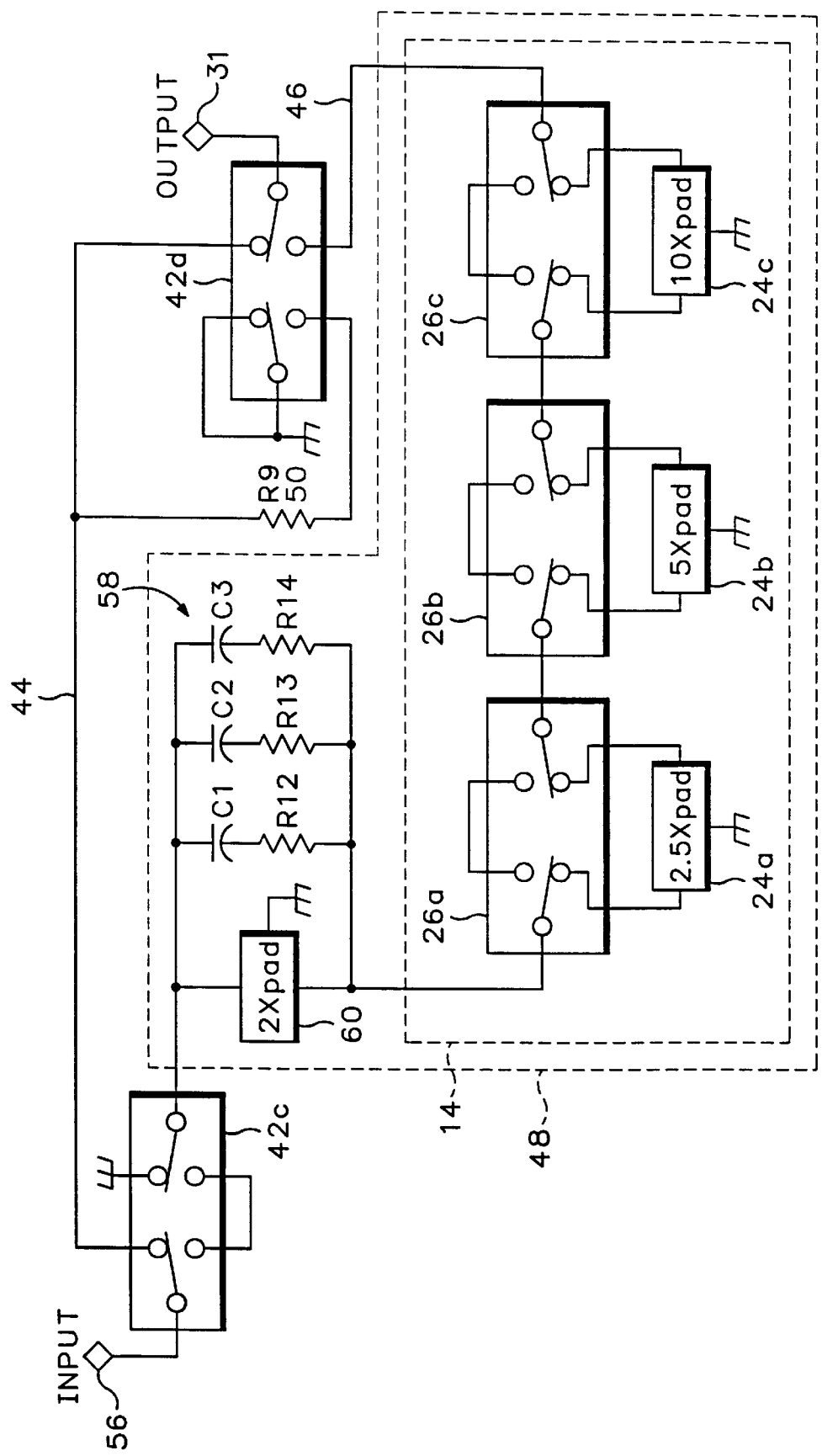
FIG. 3 is a schematic diagram of a first embodiment of a step attenuator according the principles of the present invention.

Turning now to FIG. 3, a first embodiment of an attenuator section according to the present invention comprises a signal input 56, a DPDT switch 42c analogous to DPDT switch 42a, a non-attenuated path 44, a DPDT switch 42d analogous to DPDT switch 42b, and an attenuated path 46, including conventional step attenuator 14 and a compensation circuit 58. The compensation circuit 58 comprises an attenuator pad 60 and one or more reactive and resistive elements in parallel therewith to compensate for the impedances of the DPDT switches 26a, 26b and 26c in the step attenuator 14. The reactance and resistance elements may comprise one or more series capacitor-resistor elements, C1 and R12, C2 and R13, and C3 and R14, though other combinations of elements, including reactance elements, may be used when necessary to meet desired performance goals. At low frequencies, the attenuation through the compensation circuit is governed by the attenuator pad 60, and the degradation, including phase and amplitude distortion, introduced by the DPDT switches 26a, 26b, and 26c, is of minimal consequence. At high frequencies, the degradation introduced by those switches becomes significant, but the reactance elements in parallel with the attenuator pad 60 compensate for that degradation by shunting the signal around attenuation pad 60 and shifting the phase. It can be seen that some degradation is introduced by SPDT switches 42c and 42d. However, by providing non-attenuated path 44 separate from attenuator 14, five switch contacts and their associated degradation are eliminated in the non-attenuated path. In the attenuated path, two switch contacts are introduced, but the degradation from the switch contacts of DPDT switches 26a, 26b and 26c is eliminated, with the result that, in comparison to the prior art, four switch contacts are eliminated.

Figure 4:
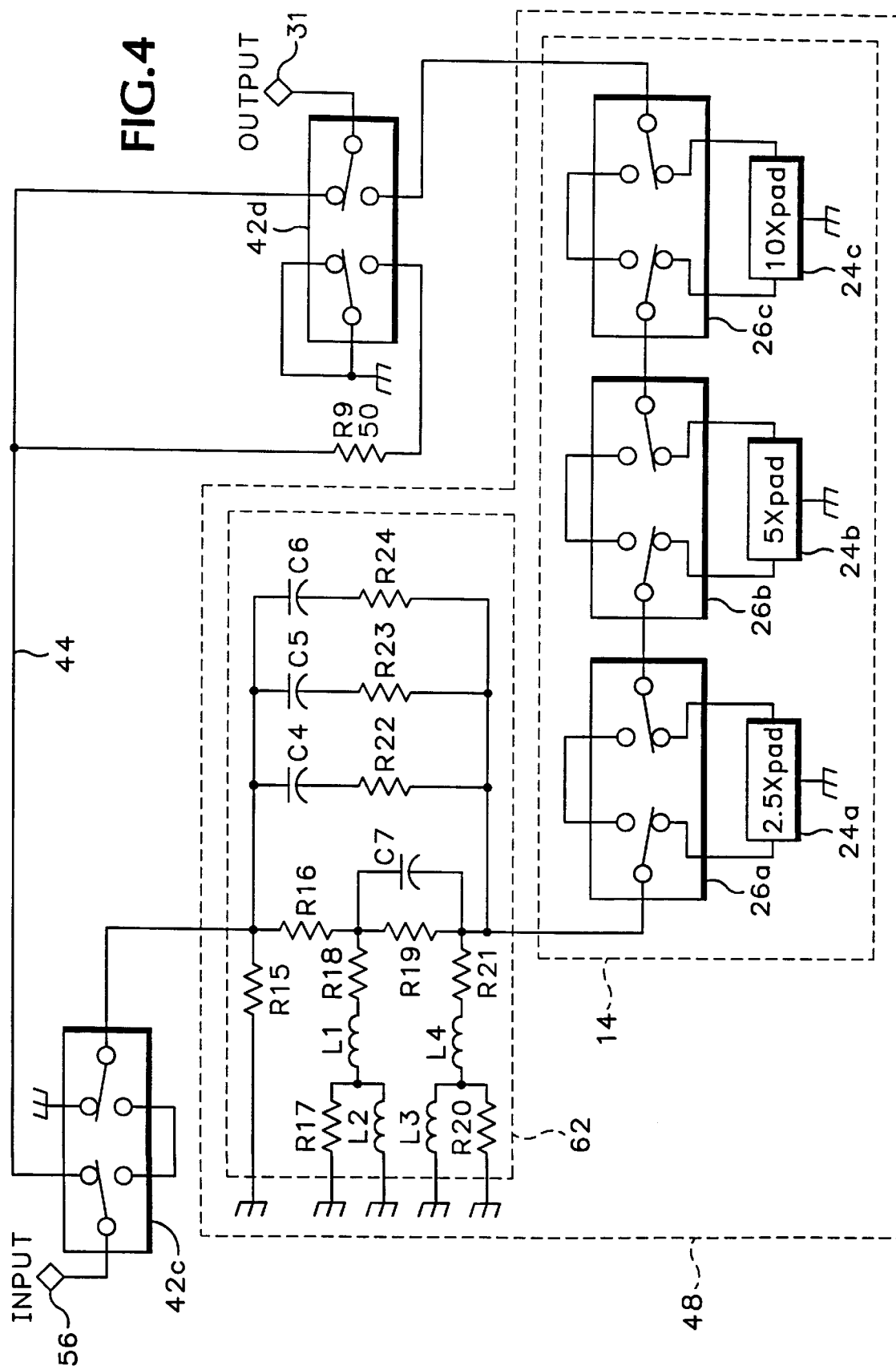
FIG. 4 is a schematic diagram of a second embodiment of a step attenuator according to the principles of the present invention.

A second embodiment of an attenuator section according to the present invention is shown in FIG. 4. It is the same as the attenuator section shown in FIG. 3, except that attenuator pad 60 and compensation circuit 58 are replaced by compensated pad 62. Resistors R15 through R21 act as a conventional attenuator pad at low frequencies. Series capacitor-resistor elements, C4 and R22, C5 and R23, and C6 and R24 compensate for low-to-intermediate frequencies. Capacitor C7 compensates for intermediate frequencies. Inductors L1 through L4 compensate for high frequencies. While either the circuit of FIG. 3 or the circuit of FIG. 4 will meet the requirements of the invention, the circuit of FIG. 4 may meet more stringent specifications. In either case, the values of the resistors, capacitors and inductors are selected based on the transfer function of the step attenuator 14 for which compensation is required. That is, the impedance components of the compensator circuit should be chosen such that the product of the transfer function of the attenuator pad 60 and compensation circuit 58, or the compensated pad 62, as the case may be, multiplied by the transfer function of the step attenuator 14 is substantially unity times the desired amount of attenuation.

It is to be understood that other attenuator arrangements could be used in place of attenuator 14, that other compensation circuits could be used in place of compensation circuit 58 and compensated pad 62, and that the attenuator pads employed could be varied to achieve whatever amount of attenuation is needed, without departing from the principles of the invention. It is also to be understood that, while the architectures of FIG. 3 and FIG. 4 have been shown for use in the calibration circuit and method described herein, the attenuators of FIG. 3 and FIG. 4 could be used in other systems for other purposes, for example, as an output signal attenuator on a signal generator.

The terms and expressions which have been employed in the foregoing specification are used therein as terms of description and not of limitation, and there is no intention in the use of such terms and expressions of excluding equivalents of the features shown and described or portions thereof, it being recognized that the scope of the invention is defined and limited only by the claims which follow.

We claim:

1. A calibration circuit, comprising:

a signal input terminal;

an output terminal;

a reference signal input connection;

an attenuated signal path, including; a stepped attenuator having at least three series-connected attenuator stages, said stepped attenuator having an input connection and an output connection, said series-connected attenuator stages forming said attenuated signal path from said input connection to said output connection, each of said series-connected attenuator stages including a switch for bypassing a respective one of said attenuator stages;

an unattenuated signal path selectively bypassing said stepped attenuator;

a first path selection switch having a first input for coupling said signal input terminal to said input connection of said stepped attenuator or to said unattenuated path, and a second input for connecting said reference signal input to the other one of said unattenuated path or said stepped attenuator; and a second path selection switch having a first output for coupling said output terminal to said output connection of said stepped attenuator or to said unattenuated path, and a second output for connecting said output to the other one of said unattenuated path or said output connection of said stepped attenuator.

2. The calibration circuit of claim 1 further including an amplifier having an input coupled to said reference signal input connection and a output couple to said unattenuated signal path, said amplifier being a voltage-to current converter exhibiting an output current proportional to it input voltage.

3. The calibration circuit of claim 2, wherein said output connection of said amplifier is connected to said unattenuated path through a resistor.

4. The calibration circuit of claim 2, further comprising a sense signal output connection and a sense signal path from said unattenuated path to said sense signal output connection.

5. The calibration circuit of claim 4, wherein said sense signal path includes a sense amplifier having an input connection connected to said unattenuated path and an output connection connected to said sense signal output connection.

6. The calibration circuit of claim 5, wherein said input connection of said sense amplifier is connected to said unattenuated path through a resistor.

7. The calibration circuit of claim 1 further including an amplifier having an input cupped to said reference signal input connection and a output couple to said unattenuated signal path, said amplifier being a voltage amplifier.

8. The calibration circuit of claim 7, wherein said output connection of said voltage amplifier is connected to said unattenuated path through a resistor.

9. The calibration circuit of claim 7, wherein the output impedance of said voltage amplifier is selectable.

10. The calibration circuit of claim 1, wherein said amplifier comprises a voltage amplifier, said voltage amplifier having an input connection and an output connection, and a voltage-to-current converter said voltage-to-current converter having an input connection and an output connection, said input connection of said voltage amplifier and said input connection of said voltage-to-current converter being connected to said reference signal input connection, and a first switch for connecting said unattenuated path either to said output connection of said voltage amplifier or to said output connection of said voltage-to-current converter.

11. The calibration circuit of claim 10, wherein said first switch is connected to said unattenuated path through a first resistor.

12. The calibration circuit of claim 11, further comprising a second switch, interposed between said first switch and said first resistor, for connecting said first resistor either to said first switch or to a resistive load.

13. The calibration circuit of claim 12, further comprising a second resistor connected to said first switch, a third resistor connected to said unattenuated path, and a third switch interposed between said second resistor and said third resistor for connecting said second resistor to said third resistor.

14. The calibration circuit of claim 13, further comprising a sense signal output connection, a sense signal amplifier having an output connection connected to said sense signal output connection and an input connection connected to said third switch, said third switch being adapted to connect said third resistor either to said second resistor or to said input connection of said sense signal amplifier.

15. The calibration circuit of claim 14, wherein said unattenuated path comprises a microstrip conductor disposed on a substrate, and said first and third resistors comprise thick film resistors disposed, in part, over said microstrip.

16. The calibration circuit of claim 1, further comprising a compensation circuit connected in said attenuated path, said compensation circuit providing said attenuated path with substantially the same transfer function for high frequency signals as for low frequency signals.

17. The calibration circuit of claim 16, wherein said attenuated path comprises a plurality of attenuation pads and respective switches connected in series such that one or more of said attenuation pads may be switched into or out of said attenuated path said compensation circuit being adapted to compensate for all of said switches.

18. The calibration circuit of claim 17, wherein said compensation circuit comprises a passive network connected in series with said attenuation pads and switches and having impedance components selected so that product of the transfer function of said compensation circuit multiplied by the transfer function of the attenuator pads and switches is substantially unity times the desired amount of attenuation.

* * * * *